United States Patent
Onozawa

Patent Number: 5,290,714
Date of Patent: Mar. 1, 1994

[54] METHOD OF FORMING SEMICONDUCTOR DEVICE INCLUDING A CMOS STRUCTURE HAVING DOUBLE-DOPED CHANNEL REGIONS

[75] Inventor: Kazunori Onozawa, Takasaki, Japan
[73] Assignee: Hitachi, Ltd., Tokyo, Japan
[21] Appl. No.: 941,825
[22] Filed: Sep. 8, 1992

Related U.S. Application Data

[63] Continuation of Ser. No. 637,240, Jan. 3, 1991, abandoned.

[30] Foreign Application Priority Data

Jan. 12, 1990 [JP] Japan ................ 2-3443

[51] Int. Cl.⁵ .......................... H01L 21/265
[52] U.S. Cl. ........................ 437/27; 437/34; 437/45; 437/57; 148/DIG. 9
[58] Field of Search ............. 437/27, 45, 59, 34, 437/29, 57; 148/DIG. 9, DIG. 82

[56] References Cited

U.S. PATENT DOCUMENTS

| | | | |
|---|---|---|---|
| 4,484,388 | 11/1984 | Twasaki | 437/59 |
| 4,596,068 | 6/1986 | Peters, Jr. | 437/45 |
| 4,948,746 | 8/1990 | Beasom | 437/29 |
| 5,019,520 | 5/1991 | Komosi et al. | 437/34 |
| 5,075,242 | 12/1991 | Nakahara | 437/45 |
| 5,081,052 | 1/1992 | Kobayashi et al. | 437/45 |
| 5,100,811 | 3/1992 | Winnerl et al. | 437/31 |

FOREIGN PATENT DOCUMENTS 2-72661 3/1990 Japan.

OTHER PUBLICATIONS

NIKKEI Electronics, Mar. 10, 1986, pp. 199–217.
Denshi Zairyo, Jun. 1986, pp. 75–79.
Submicron Devices, Maruzen, Co., Ltd., pp. 152–170.

*Primary Examiner*—Brian E. Hearn
*Assistant Examiner*—Tuan Nguyen
*Attorney, Agent, or Firm*—Pennie & Edmonds

[57] ABSTRACT

A semiconductor device has, in one embodiment, a p type insulated gate field effect transistor formed in an n type well formed on a semiconductor substrate and an n type insulated gate field effect transistor formed in a p type well formed on the semiconductor substrate. Each of the p type and n type insulated gate-field effect transistors has a composite impurity layer under its gate electrode in a surface portion of its associated well. The composite impurity layer includes a first doped layer of a p type and a second doped layer of an n type adjacent thereto to form a pn junction layer therebetween, while the composite impurity layer includes a first doped layer of a p type and a second doped layer of a p type adjacent thereto to form a junction layer therebetween having a p type impurity concentration lower than that of the p type well.

23 Claims, 8 Drawing Sheets

METHOD OF FORMING SEMICONDUCTOR DEVICE INCLUDING A CMOS STRUCTURE HAVING DOUBLE-DOPED CHANNEL REGIONS

This application is a continuation of Ser. No. 07/637,240, field Jan. 3, 1991, now abandoned.

BACKGROUND OF THE INVENTION

The present invention relates to a semiconductor device having complementary metal oxide semiconductor field effect transistor (hereinafter referred to as CMOS) devices and in particular to a BiCMOS type semiconductor device having CMOS transistors and bipolar transistors. A term "CMOS transistor" or "MOSFET" used herein is not limited to a transistor having an oxide layer as a gate insulating layer and includes a transistor having a nitride layer or a multi-layer structure of a nitride layer and an oxide layer.

Bipolar devices have a high drive ability and a high mutual conductance (gm) whereas CMOS devices have a low power consumption and a high integration degree. Hence, BiCMOS devices including bipolar devices and fine CMOS devices monolithically formed, which operate at fast speed and a low power consumption have been developed. Semiconductor devices having CMOS transistors and bipolar transistors on one and the same semiconductor substrate is described in an article "Bipolar CMOS RAM which is becoming influential in fast and high integrated memories", NIKKEI ELECTRONICS, published by NIKKEI BP Co., Ltd., Mar. 10, 1986, pp. 199-217 and in an article "Hi-BiCMOS technology which has realized 64KSRAM", Denshi Zairyo,, Published by Kohgyo Chosakai, June 1986, pp. 75-79.

These articles describe that high performance BiCMOS devices which operate at fast speed and lower power consumption and provide basic circuits having excellent performances, which cannot be obtained solely by either of bipolar and CMOS transistors, are manufactured by forming bipolar and CMOS transistors in a basic logical circuit in a composite manner. The latter article describes the dependency of device characteristic on process parameters and illustrates the impurity concentration distribution of n- and p-wells and the sectional structure of an NMOS and the expansion of a depletion layer. The latter article also describes that the disclosed devices have a feature that a buried well structure provides a low impurity concentration region between a surface shallow well which controls the threshold voltage of the MOS transistor and a buried layer.

A technology for controlling the threshold voltage of a buried channel type PMOS transistor in which the surface of the n-well is made of p-type if n-type polycrystal silicon is used for a gate electrode is described in "Submicron Devices I: Electronics Material series" published by Maruzen Co., Ltd. pp. 152-170.

Japanese Unexamined Patent Publication JP-A-2-72661 (published Mar. 12, 1990) discloses that channel regions of PMOS transistors are double injected so that the breakdown voltage across source and drain of the PMOS transistors is enhanced and the threshold voltage is controlled.

High performance Bi-CMOS devices have excellent various features such as multi-performances, high integration degree, low power consumption and high drive ability.

Figure 1:
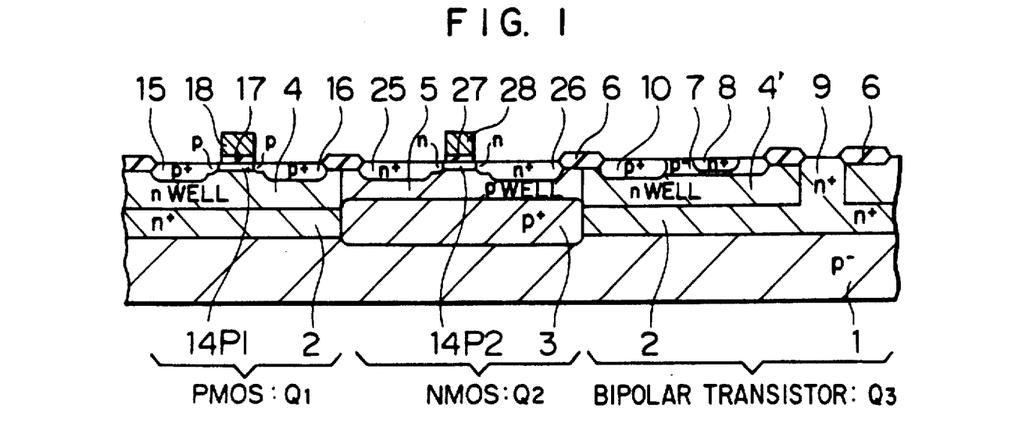

A high-BiCMOS device having these features which is shown in, for example, FIG. 1 may be considered although it is not publicly known.

Referring now to FIG. 1, a p type MOSFET $Q_1$, an n type MOSFET $Q_2$, a bipolar transistor $Q_3$ are formed on one and the same p type semiconductor substrate. A plurality of n+ type diffusion layers (not two layers are illustrated in the drawing) and p+ type diffusion layers (only one layer is illustrated in the drawing) are formed in different regions on the main surface of a semiconductor substrate 1. The n type wells 4 and 4' which have the same conductivity type as the n+ type diffusion layer 2 are formed thereon and a p type well 5 having the same conductivity type as the p+ type diffusion layer 3 is provided thereon. An oxide layer (local oxidation of silicon "LOCOS" oxide layer) 6 is selectively formed on the n type wells 4, 4' and a p type well 5 by a LOCOS process.

In FIG. 1, two n type wells 4 and 4' are provided adjacent to the p type well 5 on the opposite sides thereof. The NMOS transistor $Q_2$ is provided on the p type well 5 and the bipolar transistor $Q_3$ is formed on the n type well 4'. The PMOS transistor $Q_1$ is formed on the n type well 4.

The bipolar transistor $Q_3$ comprises a p− type base region 7 formed in the surface portion of the n type well 4', an n+ type emitter region 8 formed in the surface portion of a part of the base region 7, an n+ type collector leading diffusion layer 9 separated from the base region 7 and extending from the surface of the device to the lower n+ type diffusion layer 2 and a p+ type outer base region 10 formed in a part of the base region 7.

The PMOS transistor $Q_1$ is formed in the n type well 4 and comprises p+ type source and drain regions 15 and 16 formed on the surface portion of the n type well 4 and a gate insulating layer (gate oxide layer) 17 on the n type well between the source and drain regions 15 and 16. A gate electrode 18 formed of a polysilicon layer is provided on the gate insulating layer 17.

The NMOS transistor $Q_2$ comprises n+ type source and drain regions 25 and 26 on the surface portion of the p type well 5 and a gate insulating layer (oxide layer) 27 on the surface of the p type well 5 between the source and drain regions 25 and 26. A gate electrode 28 is provided on the gate insulating layer 27.

The gate electrodes 18 and 28 of the PMOS and NMOS transistors $Q_1$ and $Q_2$ are formed of an n type polysilicon and both gate insulation layers 17 and 27 are formed of a silicon oxide layer. The surface of the device between the elements is covered with a thick LOCOS oxide layer (silicon oxide layer) 6. Spacers covering the sides of the gate electrodes and emitter electrodes are omitted in the drawing for simplicity of illustration.

The CMOS device having the above mentioned structure includes the n+ type diffusion layer 2 and the p+ type diffusion layer 3 having a higher concentration of each impurity buried bellow the n type wells 4 and 4' and the p type well 5, resulting in a reduction of a parastic collector series resistance, an increase in isolation breakdown voltage between buried collectors themselves and an enhancement of immunity for a latch-up between PMOS and NMOS transistors.

Furthermore, in such a CMOS structure, p type impurity layer 14P1 is formed in the surface portion of the n type well 4 under the gate insulating layer 17 of the PMOS transistors $Q_1$ for the purpose of controlling the threshold voltage of the PMOS transistor. A p type impurity layer 14P2 is similarly formed in the surface portion of the p type well 5 under the gate insulating layer 27 of the NMOS transistor.

Figure 2:
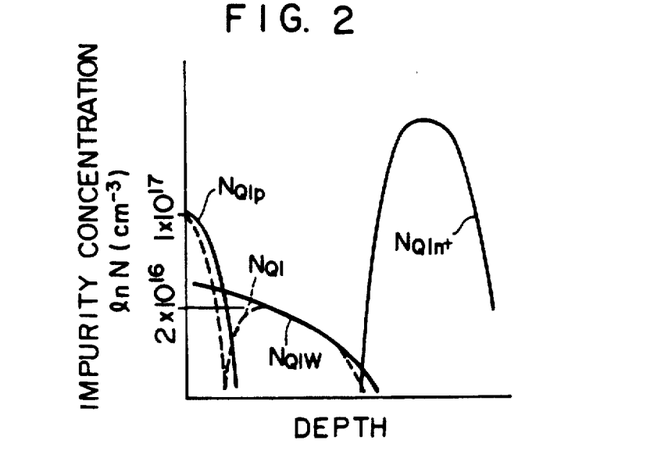
FIG. 2 is a graph showing the impurity concentration distribution in a thicknesswise direction under a gate electrode of a PMOS transistor in the structure of FIG. 1.
Figure 3:
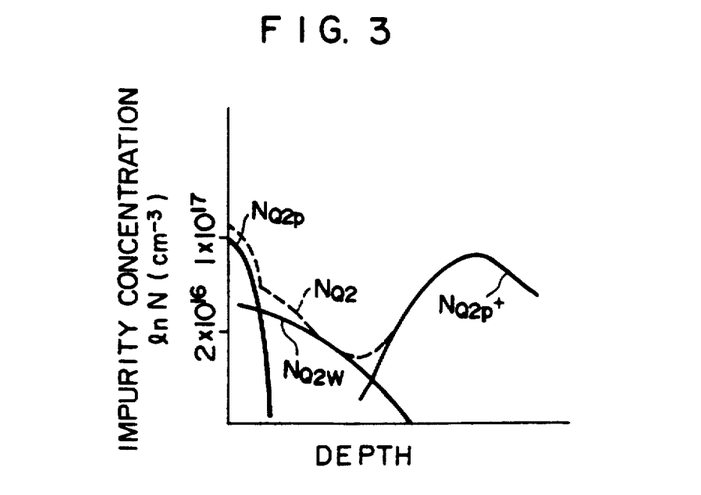
FIG. 3 is a graph showing the impurity concentration distribution in a thicknesswise direction under a gate electrode of an NMOS transistor in the structure of FIG. 1.

FIG. 2 is a graph showing the impurity concentration distribution in a depth direction under the gate insulating layer 17 of the PMOS transistor $Q_1$. FIG. 3 is a graph showing the impurity concentration distribution in a thicknesswise direction under the gate insulating layer 27 of the NMOS transistor $Q_2$. It is apparent from both FIGS. 2 and 3 that the concentration distributions of the transistors $Q_1$ and $Q_2$ are determined by the impurity concentrations $N_{Q1W}$ and $N_{Q2W}$ of the wells having opposite conductivity types of the source and drain and the impurity concentrations $N_{Q1P}$ and $N_{Q2P}$ of the p type surface impurity layers 14P1 and 14P2. That is, the p type impurity layer 14P1 is formed for the purpose of controlling the threshold voltage of the PMOS transistor, resulting in that the concentration $N_{Q1P}$ of the p type impurity in the vicinity of the gate insulating layer of the PMOS transistor $Q_1$ is selected so that it is less thin the concentration $N_{Q1W}$ of the n type impurity forming the well. Both of peak values of the impurity concentrations $N_{Q1P}$ and $N_{Q2P}$ of the p type surface impurity layers 14P1 and 14P2 of the PMOS and NMOS transistors $Q_1$ and $Q_2$ are about $1 \times 10^{17}$ cm$^{-3}$. The impurity concentration at the interface between the impurity concentration $N_{Q1P}$ of the p type impurity layer 14P1 and the impurity concentration $N_{Q1W}$ of the n type well 4 in the PMOS transistor $Q_1$ of the FIG. 2 is about $2 \times 10^{16}$ cm$^{-3}$ while the impurity concentration at the interface between the impurity concentration $N_{Q2}$ of the p type laver 14P2 and impurity concentration $N_{Q2W}$ of the p type well 5 in the NMOS transistor $Q_2$ of FIG. 3 is about $4 \times 10^{16}$ cm$^{-3}$.

Figure 4A:
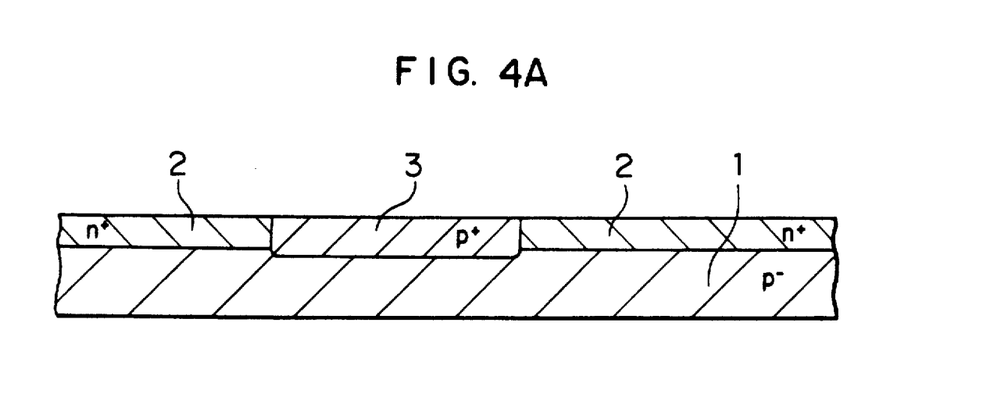
FIGS. 4A through 4C are sectional views showing steps of a manufacturing process of a BiCMOS structure of FIG. 1.
Figure 4B:
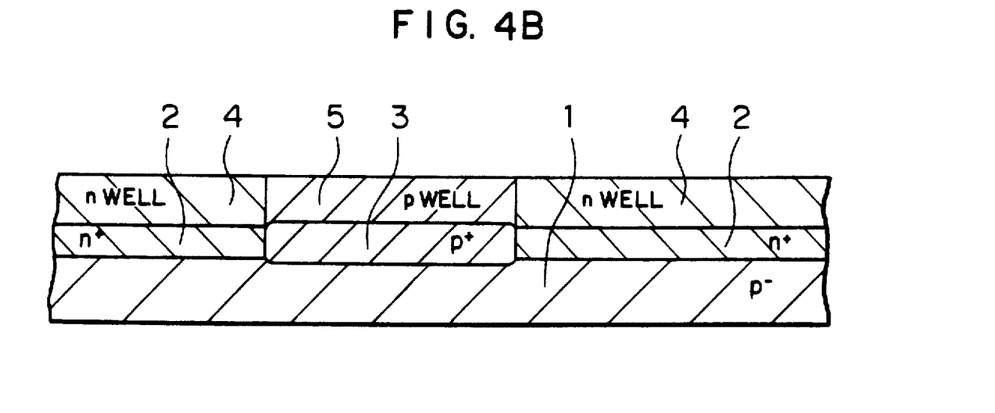
Figure 4C:
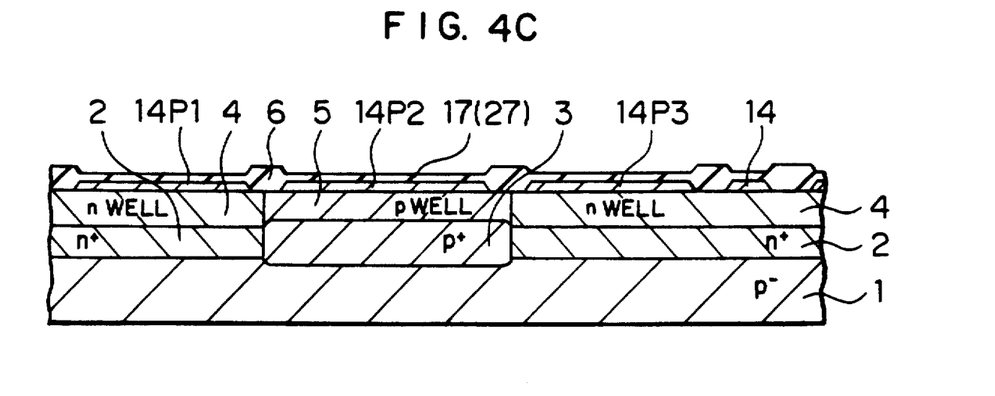

The BiCMOS device having such a structure shown in FIG. 1 is manufactured through steps as shown in FIGS. 4A through 4C.

Firstly, a p$^-$ type semiconductor substrate 1 is prepared as shown in FIG. 4A. Thereafter a desired number of n+ and p+ type diffusion layers 2 and 3 having a high impurity concentration are formed in separate regions on the main surface of the p type semiconductor substrate. In this case, the p$^+$ type diffusion layer 3 is provided in the center of the drawing and the n$^+$ type diffusion layers 2 are disposed on the opposite sides of the p$^+$ type diffusion layer 3.

Then, an epitaxial growth processing is performed to deposit an epitaxial grown layer on the main surface of the p type semiconductor substrate 1 as shown in FIG. 4B. The n type wells 4 and 4' having the same conductivity as that of the underlying diffusion layer 2 are formed by injecting phosphorus into those portion of the epitaxial layer which are on the layers 2, while a p type well 5 having the same conductivity as the underlying diffusion layer 3 is formed by injecting boron or BF$_2$ into that portion of the epitacial layer which is on the layer 3.

The thick oxide layer (LOCOS oxide layer) is then formed for isolating elements and thereafter p type impurity layers 14P1, 14P2 and 14P3 and a gate insulating layer 17 (27) are formed as shown in FIG. 4C.

Thereafter, each of elements such as the bipolar transistor Q3, the PMOS transistor Q1 and NMOS transistor Q2 are formed on respective regions. That is, the base region 7, the emitter region 8, the collector leading diffusion layer 9 and the outer base 10 are formed in the right n type well 4 and the gate insulating layer 27, the gate electrode 28, the source region 25 and the drain region 26 are formed in the central p type well 5 and a gate insulating layer 17, the gate electrode 18, the source region 15 and the drain region 16 are formed in the left n type well 4.

SUMMARY OF THE INVENTION

However, the inventor has found that the above mentioned technology has problems as follows.

Figure 5:
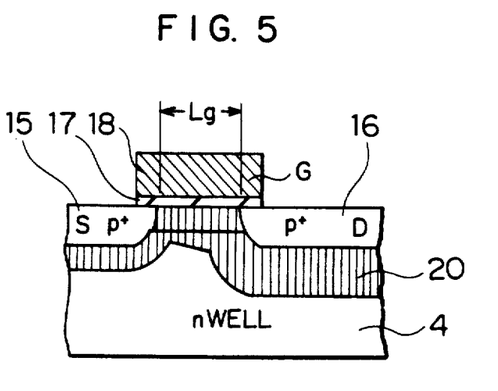
FIG. 5 is a schematic view showing a depletion layer region when the PMOS transistor is turned off in the structure of FIG. 1.

The threshold voltage of the PMOS transistor in FIG. 1 is controlled by providing the p type impurity layer 14P1 in the surface of the n type impurity well 4. Investigation of a finer structure of the MOS transistor shows that there will occur a problem as follows. Referring to FIG. 5, a depletion layer 20 comprises a portion effected by source (S) and drain (D) electric charges and a portion effected by gate (G) electric charges as represented by hatching lines. As a gate length Lg decreases, the influence of the source drain charges becomes stronger. Accordingly, as the gate length Lg decreases in a PMOS transistor, the threshold voltage $|V_{TH}|$ falls, resulting in a remarkable so called short channel effect. Therefore, it is impossible to provide fine CMOS transistors, so that it is difficult to provide high speed and highly integrated LSIs.

This phenomenon can be reduced more or less if the impurity distribution of the n type well is lattened by heat treatment at high temperatures for a long period of time to reduce the expansion of the depletion layer 20 shown in FIG. 5. However, when bipolar transistors are formed on one and the same substrate as CMOS transistors, speed-up of the bipolar transistors cannot be assured unless the n$^+$ type impurity layer 2 of a high concentration shown in FIG. 1 is formed such that the boundary between the layer 2 and the well 4' is located near the surface of the well 4' and has a sharp concentration distribution. It is hard to perform heat treatment at a high temperature for a long period of time to form the above-mentioned well.

For the same reason, it is hard to flatten the impurity concentration distribution of the p type well of the NMOS transistors Q2 in the semiconductor device which is formed with the bipolar transistor Q3 shown in FIG. 1. Accordingly, it is hard to make lower the impurity concentration of the p type well 5 of a junction between the p type well 5 and the p type impurity layer 14P2 so that the mobility of electrons will lower due to an impurity scattering. Furthermore, this increases the strength of the electric field to lower the mobility so that a drain current cannot be increased.

It is an object of the present invention to provide a semiconductor device having a CMOS structure which is capable of enhancing the integration.

It is another object of the present invention to provide a semiconductor device having a CMOS structure which is capable of stably increasing a turn on current.

It is a further object of the present invention to provide a semiconductor device in which at least one n type MOSFET and one p type MOSFET are formed on one and the same substrate, and in particular to a semiconductor device in which a bipolar transistor is also formed on one and the same substrate as well as the n and p type MOSFETs and a drain current of the p type MOSFET is stably increased by suppressing the short channel effect of the p type MOSFET and by shortening the gate length and simultaneously the drain current of the n type MOSFET is increased by enhancing the electron mobility for increasing the operation speed to enhance the drive ability of the semiconductor device.

It is a further object of the present invention to provide a process for manufacturing the above mentioned semiconductor device.

According to one aspect of the present invention, a semiconductor device includes a semiconductor substrate; at least one first well of a first conductivity type formed on the substrate; at least one second well of a second conductivity type formed on the substrate; a first insulated gate field effect transistor formed in the first well and having a gate formed over and insulated from the first well and source and drain regions formed in the first well; and a second insulated gate field effect transistor formed in the second well and having a gate formed over and insulated from the second well and source and drain regions formed in the second well, in which the first field effect transistor has a first composite impurity layer formed in a surface portion of the first well between the source and drain regions, the first composite impurity layer including first doped (impurity) layer of the second conductivity type constituting a main surface of the first well and a second doped (impurity) layer of the first conductivity type adjacent to the first doped layer to form a pn junction layer therebetween, and the second field effect transistor has a second composite impurity layer formed in a surface portion of the second well between the source and drain regions, the second composite impurity layer including a first doped (impurity) layer of the second conductivity type constituting a main surface of the second well and a second doped (impurity) layer of the second conductivity type adjacent to the first doped layer to form a junction layer therebetween having an impurity concentration of the second conductivity type lower than that of the second well.

According to another aspect of the present invention, a semiconductor device comprises a semiconductor substrate, a plurality of wells formed on the substrate and PMOS transistors, NMOS transistors and bipolar transistors which are formed in the different wells having different conductivities, and composite impurity layers each having a p type heavily doped layer in a surface portion of a well under gate insulating layers of PMOS and NMOS transistors and an n type lightly doped layer positioned adjacent to the p type layer on the substrate side.

In one embodiment, the above-mentioned composite impurity layer may include a p-type impurity layer heavily doped to a high concentration, for example, $1 \times 10^{17}$ cm$^{-3}$ for controlling the threshold voltage value of PMOS transistors and an n type impurity layer lightly doped to a low concentration, for example, $1 \times 10^{15}$ cm$^{-3}$ at a depth of about 0.1 to 0.3 μm from the surface portion so that a part of the p type impurity layer is compensated for.

In accordance with one embodiment of a semiconductor device of the present invention, a p type impurity layer is provided in a surface portion of a p type well under gate insulating layers including an n type MOSFET and an n type well region including a p type MOSFET which are formed on one and the same substrate and an n type impurity layer is provided on the side of the p type impurity layer facing to the substrate. Accordingly, for the p type MOSFET, the distribution of the impurity concentration at an interface of a pn junction between both impurity layers becomes more sharp, so that the expansion of a depletion layer expanding from a drain to the substrate in a thicknesswise direction to suppress the short channel effect even if the gate length is shortened. Furthermore, for the n type MOSFET, the impurity concentration of that portion of the p type well which is immediately below the drain is lowered, so that a depletion layer at the junction between the drain and p type well tends to expand easily into the p type well toward the substrate to lower a parasitic drain junction capacitance, thereby making the device operation speed higher.

BRIEF DESCRIPTION OF THE DRAWINGS

FIG. 1 is a sectional view showing a main part of a BiCMOS structure, the development of which the present inventor has been involved in.

DESCRIPTION OF THE PREFERRED EMBODIMENTS

Embodiments in which the present invention is applied to a submicron BiCMOS device will be described.

Figure 6:
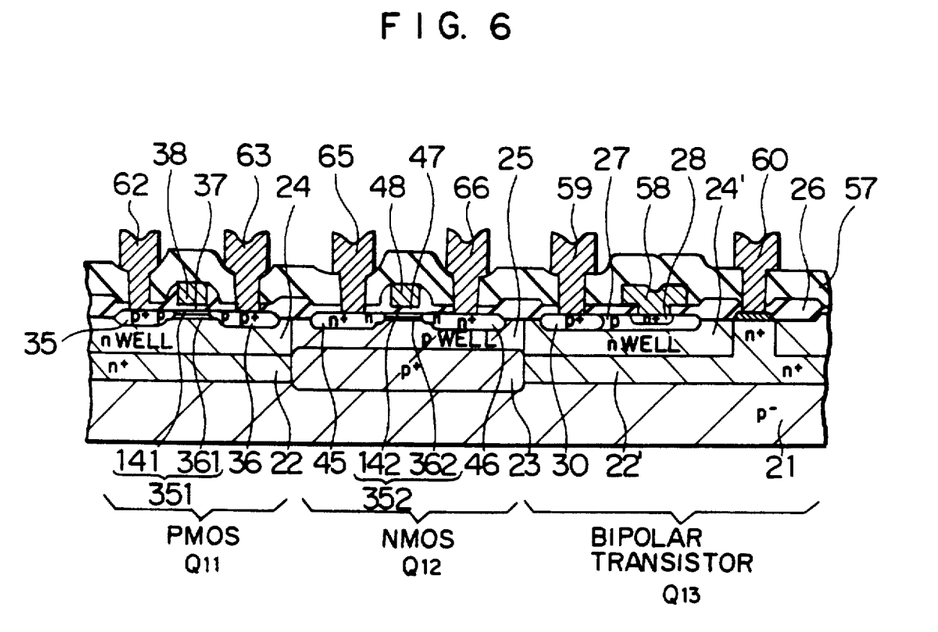
FIG. 6 is a sectional view showing a main part of a BiCMOS device in accordance with an embodiment of the present invention.

Referring now to FIG. 6, a p type MOSFET $Q_{11}$, an n type MOSFET $Q_{12}$, a bipolar transistor $Q_{13}$ are formed on one and the same p type semiconductor substrate. For example, a plurality of n+ type diffusion layers 22, 22' (only two layers are illustrated in the drawing) and p+ type diffusion layers 23 (only one layer is illustrated in the drawing) are formed in different regions on the main face of a semiconductor substrate 21. The n type wells 24 and 24' which have the same conductivity type as the n+ type diffusion layer 22, 22' are formed thereon and a p type well 25 having the same conductivity type as the p+ type diffusion layer 23 is provided thereon. An oxide layer 26 (local oxidation of silicon "LOCOS" oxide layer) is selectively formed on the n type wells 24, 24' and a p type well 25 by the LOCOS process.

Two type wells 24 and 24' are provided adjacent to the p type well 25 on the opposite sides thereof. The NMOS transistor $Q_{12}$ is provided on the central p type well 25 and the bipolar transistor $Q_{13}$ is formed on then type well 24'. The PMOS transistor $Q_{11}$ is formed on the n type well 24.

The bipolar transistor $Q_{13}$ comprises a p− type base region 27 formed in the surface portion of the n type well 24', an n+ type emitter region 28 formed in the surface portion of a part of the base region 27, an n+ type collector leading diffusion layer 29 separated from the base region 27 and extending from the surface of the device to the lower n+ type diffusion layer 22' and a P+ type outer base region 30 formed in a part of the base region 27.

The PMOS transistor $Q_{11}$ is formed in the n type well 24 and comprises p+ type source and drain regions 35 and 36 formed on the surface portion of the n type well 24 and a gate insulating layer (gate oxide layer) 37 on the n type well between the source and drain regions 35 and 36. A gate electrode 38 formed of a polysilicon layer is provided on the gate insulating layer 37.

The NMOS transistor $Q_{12}$ comprises n+ type source and drain regions 45 and 46 on the surface portion of the p type well 25 and a gate insulating layer (oxide layer) 47 on the surface of the p type well 25 between the source and drain regions 45 and 46. A gate electrode 48 is provided on the gate insulating layer 47.

The gate electrodes 38 and 48 of the PMOS and NMOS transistors $Q_{11}$ and $Q_{12}$ are formed of an n type polysilicon and both gate insulating layers 37 and 47 are formed of a silicon oxide layer. The surface of the device between the elements is covered with a thick LOCOS oxide layer (silicon oxide layer) 26. Spacers covering the sides of the gate electrodes and emitter electrodes are omitted in the drawing for simplicity of illustration.

The CMOS device having the above mentioned structure includes the n+ type diffusion layer 22 and the p+ type diffusion layer 23 having a high concentration of each impurity buried below the n type well 24 and the p type well 25, respectively resulting in a reduction of a parasitic collector series resistance, an increase in isolation breakdown voltage between buried collectors themselves and an enhancement of impurity for a latch-up between PMOS and NMOS transistors.

Furthermore, in the device having such a structure, composite impurity layers 351, 352 are provided in surface portions of the n type well 24 and the p type well 25 in PMOS and NMOS transistors $Q_{11}$ and $Q_{12}$, respectively, that is, in the surface portions between the source regions 35, 45 and the drain regions 36, 46 as is particularly shown in FIG. 6 in a large scale. The composite impurity layer 351 has a first p type doped (impurity) layer 141 including a surface of the p type well 24 between the source region 35 and the drain region 36 and a second n type doped (impurity) layer 361 adjacent to the p type impurity layer 141 and formed in the n type well 24. Similarly the composite impurity layer 352 has a first p type doped (impurity) layer 142 including a surface of the p type well 25 between the source region 45-and the drain region 46 and a second n type doped (impurity) layer 362 adjacent to the layer 142 and formed in the p type well 25.

Figure 8:
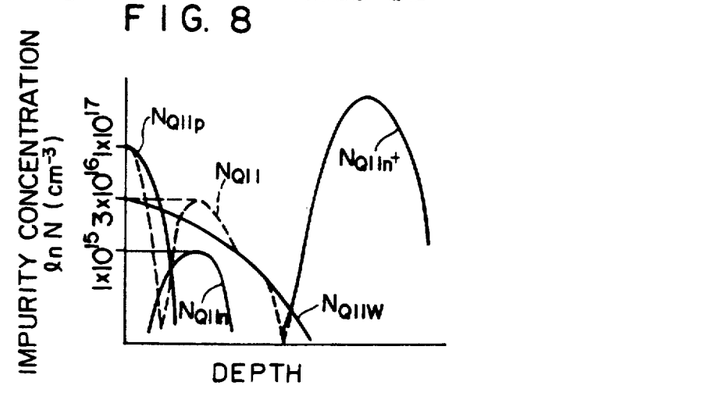
FIG. 8 is a graph showing the impurity concentration distribution in a thicknesswise direction under a gate electrode of a PMOS transistor in the CMOS structure of FIG. 7.
Figure 9:
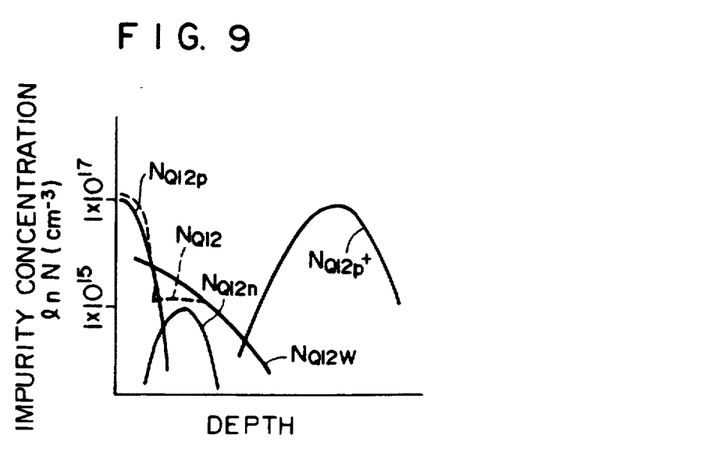
FIG. 9 is a graph showing the impurity concentration distribution in a thicknesswise direction under a gate electrode of an NMOS transistor in the CMOS structure of FIG. 7.

The impurity concentrations $N_{Q11P}$ and $N_{Q12P}$ of the p type impurity layers 141, 142 are high such as about $1 \times 10^{17}$ cm$^{-3}$ at the peak thereof while the impurity concentrations $N_{Q11}$, $N_{Q12}$ of n type impurity layers 361, 362 are low such as $10^{15}$ cm$^{-3}$ at the peak thereof in graphs of FIGS. 8 and 9. The n type impurity layers 361, 362 are formed so that the peak portions of the impurity concentration are located to a depth of 0.2 to 0.3 $\mu$m from the surface of the wells 24 and 25.

On the other hand, an inter-layer insulating layer 57 made of an SiO$_2$ layer is provided on the main surface of the p type semiconductor substrate 21. Electrodes are formed in contact holes which are formed by partially removing the inter-layer insulating layer 57 or the portion thereof. The electrodes become an emitter region 58 made of, for example, polysilicon connected with the emitter region 28, a base electrode 59 connected with the outer base 30, a collector electrode 60 connected with the collector leading diffusion layer 29 in the bipolar transistor $Q_{13}$ and a source electrode 62 connected with the source regions 35, a drain electrode 63 connected with the drain region 36 in the PMOS transistor $Q_{11}$ and a source electrode 65 connected with the source region 45 and a drain electrode 66 connected with the drain region 46 in the NMOS transistor $Q_{12}$. Spacers 72 are provided on the opposite sides of the gate electrodes 38 and 48. Although not shown, these electrodes are covered with a single or multiple insulating layers for protection and finally with a final passivation layer.

A process of manufacturing a semiconductor device having such a structure will now be described with reference to FIGS. 10 and 11A through 11G.

Figure 10:
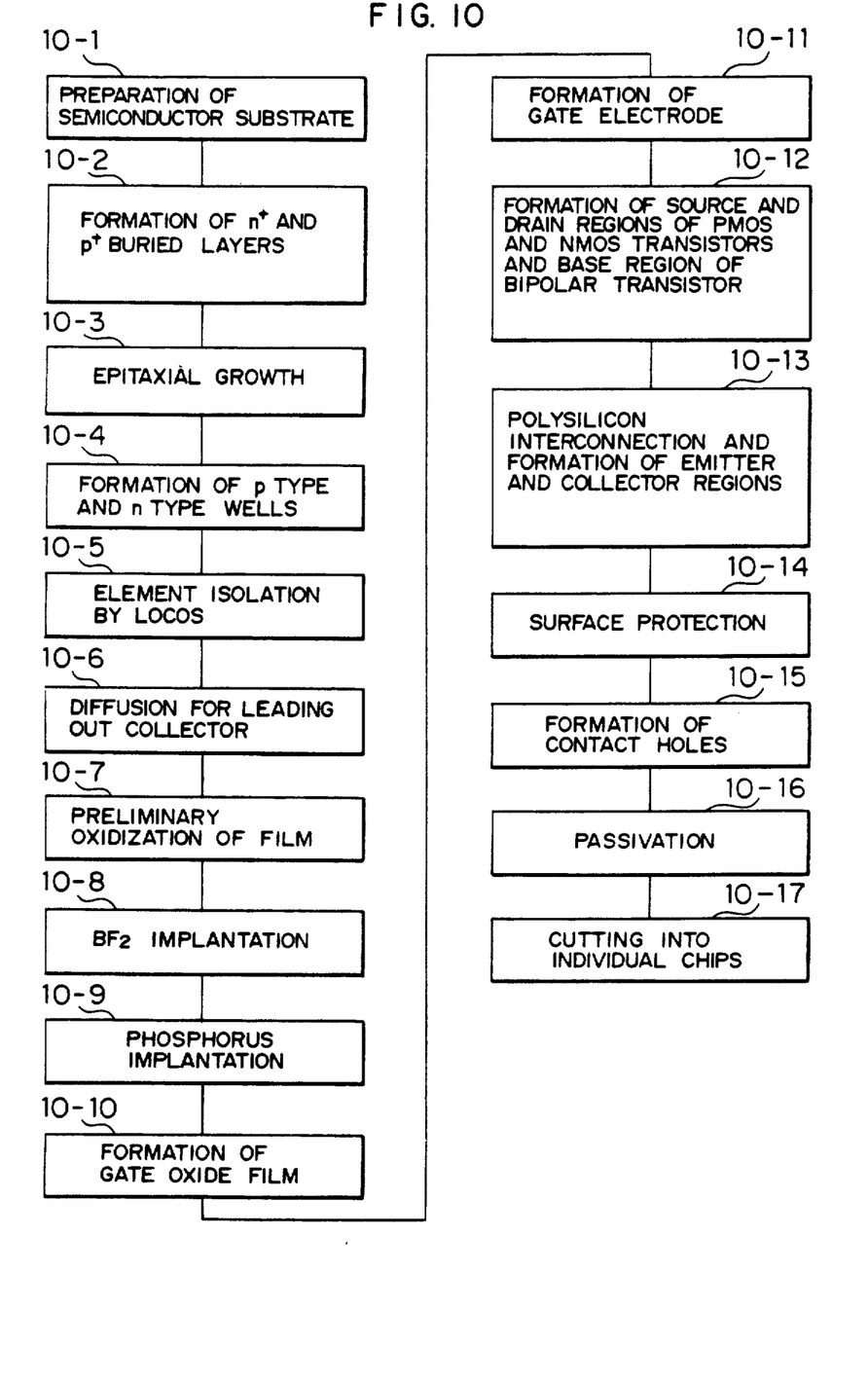
FIG. 10 is a flow chart showing a process for manufacturing a BiCMOS device in accordance with an embodiment of the present invention.

A BiCMOS device is manufactured by a manufacturing process including the steps shown in a flow chart of FIG. 10 in accordance with an embodiment of the present invention. The manufacturing process will be described with reference to FIGS. 11A through 11G.

Figure 11A:
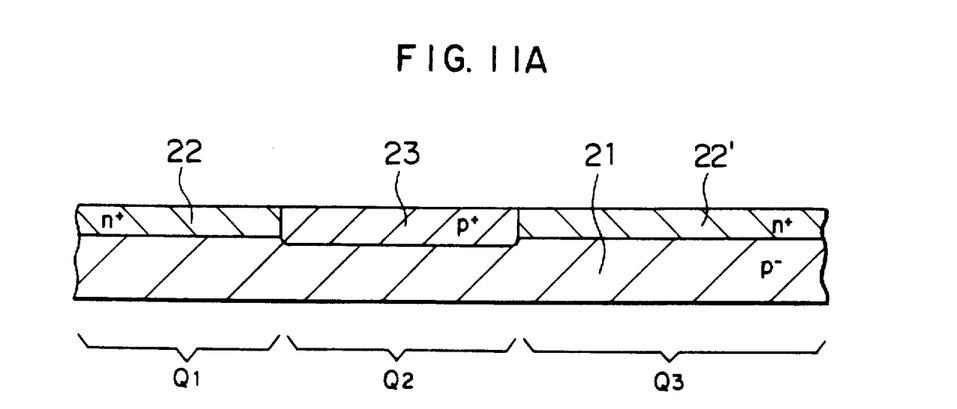
FIGS. 11A through 11G are sectional views showing the steps of the manufacturing process of a BiCMOS device in accordance with one embodiment of the present invention.

Firstly, a p type semiconductor substrate 21 having a boron impurity concentration which is in order of $1 \times 10^{15}$ cm$^{-3}$ is prepared as shown in FIG. 11A (step 10-1). Thereafter, a desired number of n+ type diffusion layers 22 and p+ type diffusion layers 23, having a high impurity concentration (for example, $\rho_s = 76\Omega/\square$) are formed in different regions on the main surface of the p type semiconductor substrate 21 (step 10-2). In order to lower the collector resistance, the n+ type buried layer 22 is formed by injecting much antimony having a low diffusion constant which will rise up to the epitaxial growth layer on the following heat treatment so that it will have a low resistance ($\rho_s = 76\Omega/\square$). The n+ type buried layer 22 and the P+ type buried layer 23 will become buried layers. The p+ type diffusion layer 23 is provided in the center of the drawing. The n+ type diffusion layers 22 and 22' are disposed on the opposite sides of the p+ type diffusion layer 23. The NMOS transistor $Q_{12}$ will be formed in the p+ type diffusion layer 23. The bipolar transistor $Q_{13}$ will be formed in the n+ type diffusion layer 22 and the PMOS transistor $Q_{11}$ will be formed in the n+ type diffusion layer 22.

Figure 11B:
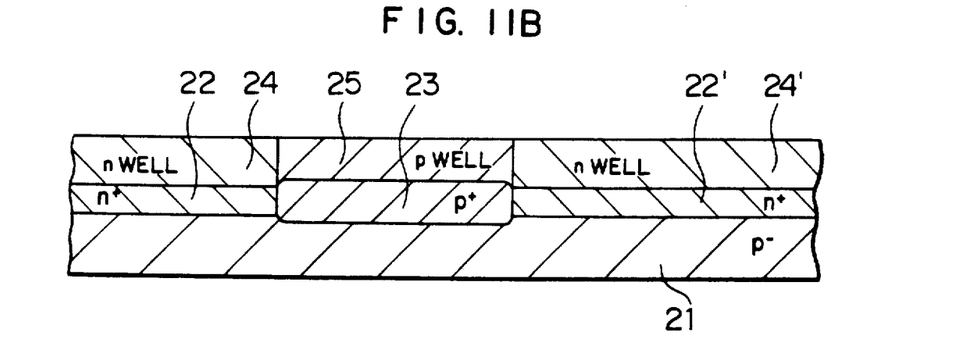

As shown in FIG. 11B, an epitaxial growth processing is performed to deposit an epitaxial growth layer on the main surface of the p type semiconductor device 21

(step 10-3). The n+ type well 24 is formed on the n+ type diffusion layer 22 by injecting phosphorus into the epitaxial growth layer and the p type well 25 having the same conductivity type as that of the p+ type diffusion layer 23 is formed thereon by injecting boron or $BF_2$ into the epitaxial growth layer (step 10-4) so that the well 24 has the same conductivity type as that of the lower layer 22. These well layers have an impurity concentration which is in order of $10^{15}$ cm$^{-3}$ and a thickness of several $\mu$m.

Figure 11C:
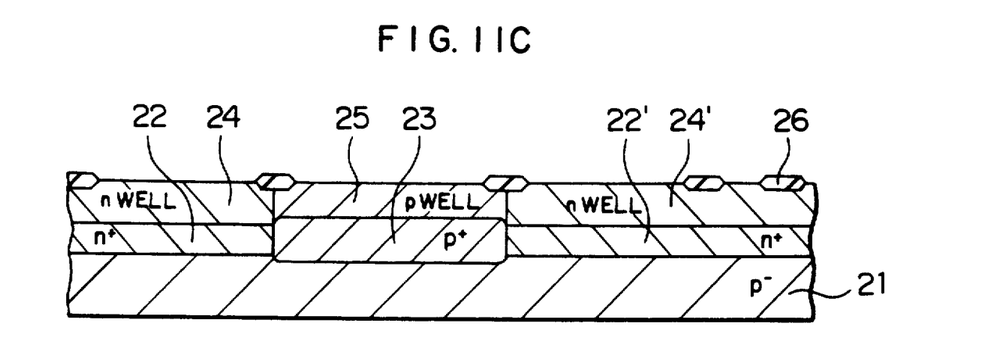

The oxide layer (LOCOS oxide layer) 26 which is 5000 to 6000 Å in thickness is then formed for isolating elements as shown in FIG. 11C (step 10-5).

Although not shown, the collector leading diffusion layer 29 having a high impurity concentration is preliminarily formed prior to formation of MOSFETs by commonly used photolithography (step 10-6). This step is needed to preliminarily form the deep collector leading diffusion layer 29 which requires a high temperature heat treatment prior to a step for forming the MOSFET since it is necessary to lower the temperature for the high temperature heat treatment as much as possible for forming a MOSFET having a short gate length.

Figure 11D:
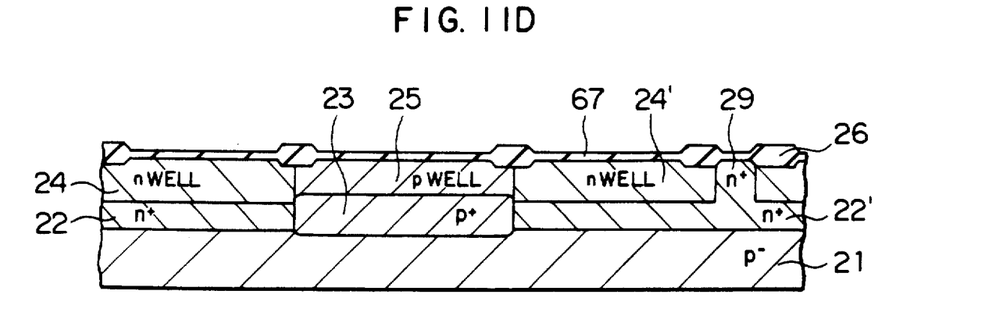
Figure 11E:
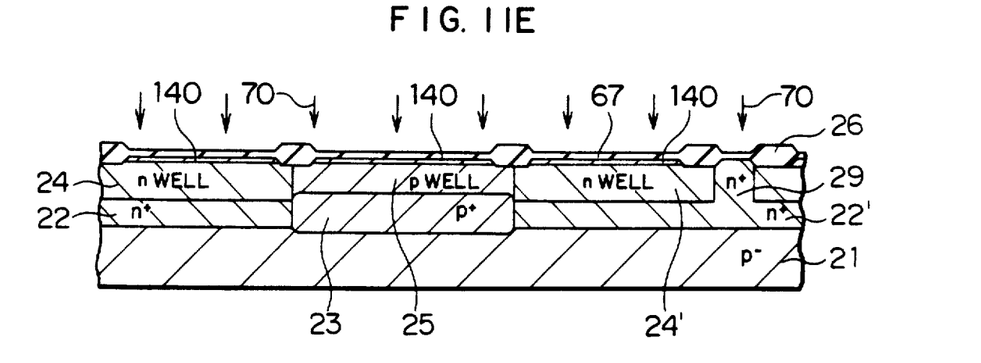

After a thin insulating layer (silicon oxide layer) 67 which is 20 to 100 nm in thickness is formed on the main surface of the p type semiconductor substrate 11 (preliminarily oxidized layer formation) (step 10-7) as shown in FIG. 11D, a p type impurity (p type impurity ions) 70 such as boron (or $BF_2$) is implanted to the entire surface for controlling the MOSFET threshold voltage so that a p type impurity layer 140 which forms one layer for composite impurity layers 351 and 352 (FIG. 6) having a peak concentration $1 \times 10^{17}$ cm$^{-3}$ (step 10-8).

Figure 11F:
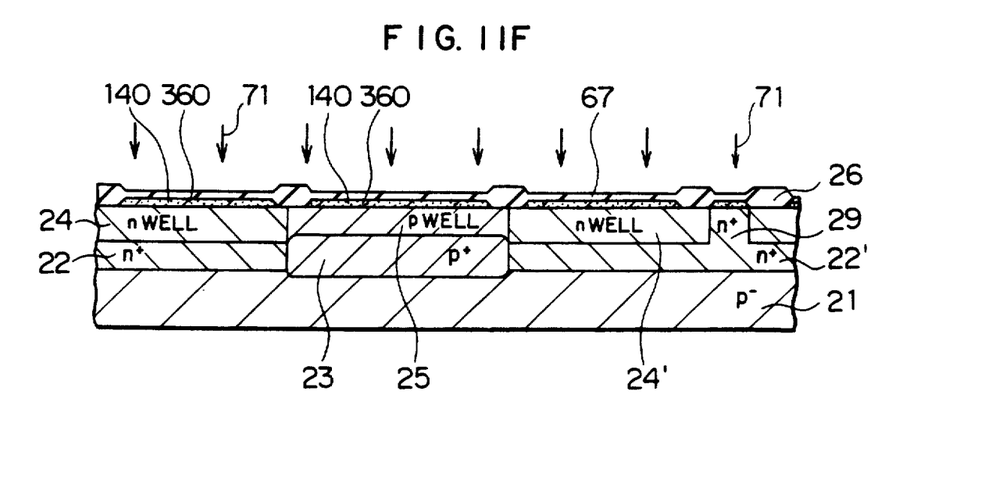
Figure 11G:
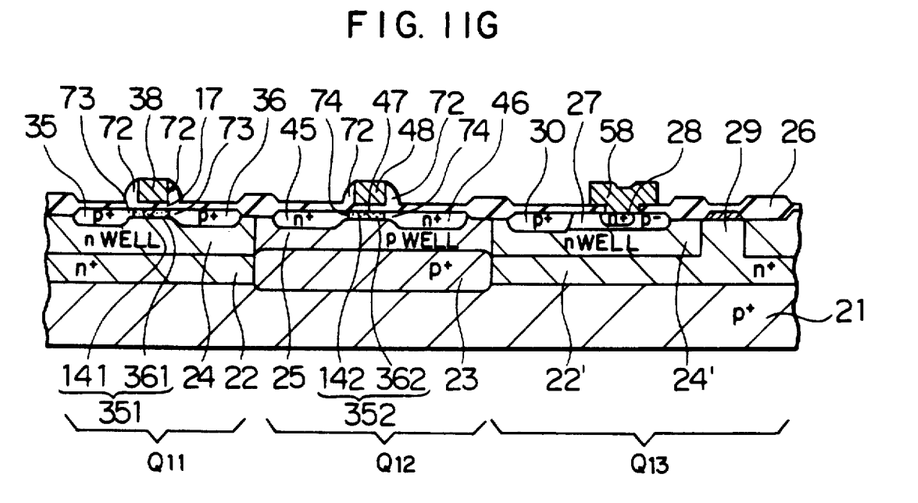

An n type impurity layer 360 which compensates for a part of the p type impurity layer 140 is formed by implanting an n type impurity (n type impurity ions, having a peak concentration of $1 \times 10^{-15}$ cm$^{-3}$ such as phosphorus onto the entire of the main surface of the p type semiconductor substrate 21 (step 10-9). At this time, the range of the n type impurity implantation is about 0.2 to 0.3 $\mu$m from the surface of the wells 24, 25 and 24' and the n type impurity layer 360 is formed p type impurity layer 140 on the buried layer 22 side. Thus, composite impurity layers 351 and 352 including the p type impurity layer 140 and an n type impurity layer 360 are formed. In FIGS. 11F and 11G, the p type impurity layers 140, n type impurity layers 360, the composite impurity diffusion layers 350 and 351 are not discriminated, but are represented by hatching lines and dots. Since the impurity (ions) implantation is carried out through the thin silicon oxide layer 67 in order to form the p type impurity layers 140 and the n type impurity layers 360 in this embodiment, the impurity implantation is uniform so that diffusion layers having an excellent impurity concentration distribution characteristics can be obtained. Accordingly, in the PMOS and NMOS transistors $Q_{11}$ and $Q_{12}$, tile impurity diffusion layer 350 having impurity characteristics shown in FIGS. 8 and 9 can be obtained.

Same effect as that of the above embodiment can be obtained even by carrying out the impurity implantation through a gate insulating layer.

Thereafter, the structure shown in FIG. 6 is obtained after a structure of FIG. 11G by forming the gate, source and drain of the CMOS transistor and the base and emitter of the bipolar transistor in accordance with the steps 10-11 through 10-13 of FIG. 10 by a conventional technique. FIG. 11G shows a section of the p type semiconductor substrate 21 in the course of manufacturing on which a bipolar transistor having an emitter electrode made of polysilicon and CMOS devices using a lightly doped drain (LDD) structure are formed. In the drawing, spacers 72 made of $SiO_2$ layer are provided on the opposite sides of the gate electrodes 38 and 48 of the PMOS and NMOS transistors $Q_{11}$ and $Q_{12}$, respectively. The low concentration p type region 73 and low concentration n type region 74 which are represented by reference numerals only in FIGS. 7 and 11G are provided in the surface portions of the well regions facing the spacers 72.

After the p type semiconductor substrate 21 has been subjected to a series of treatments (steps 11 through 16) such as surface protection (steps 11 through 14), wiring layer formation (steps 11 through 15) and passivation, the substrate is cut lengthwise and crosswise to provide BiCMOS chips. Each of these chips is housed in a desired package to become a semiconductor device.

The semiconductor device of the above mentioned embodiment has the impurity concentration distribution under the gate electrode of the p type MOSFET shown in FIG. 8 and has the impurity concentration distribution under the gate electrode of the n type MOSFET as shown in FIG. 9.

Figure 7:
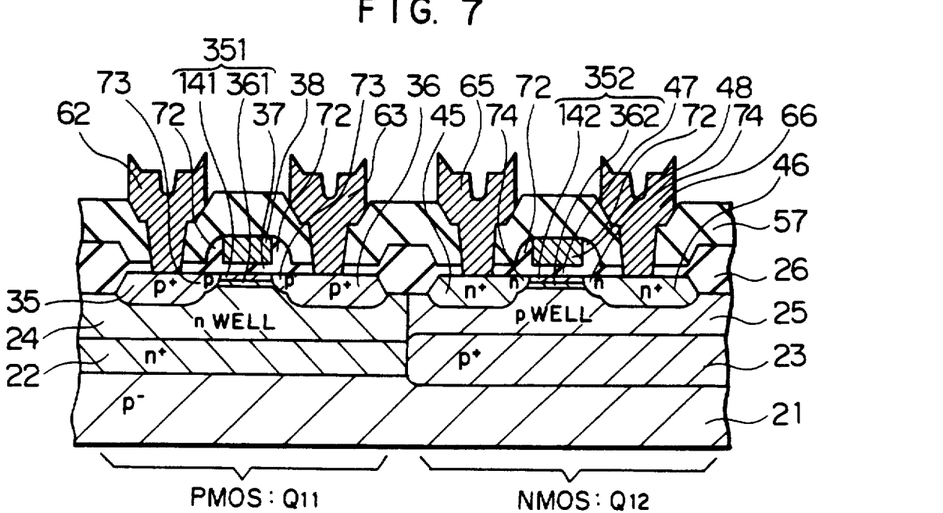
FIG. 7 is a sectional view showing a main part of a CMOS structure in a BiCMOS device in accordance with an embodiment of the present invention.
Figure 12:
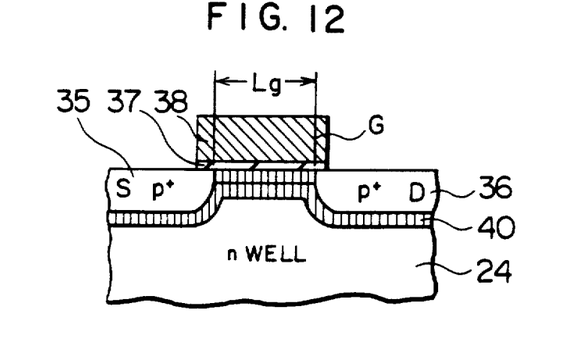
FIG. 12 is a schematic view showing a depletion region when the PMOS transistor in the CMOS structure shown in FIG. 7 is turned off.
Figure 13:
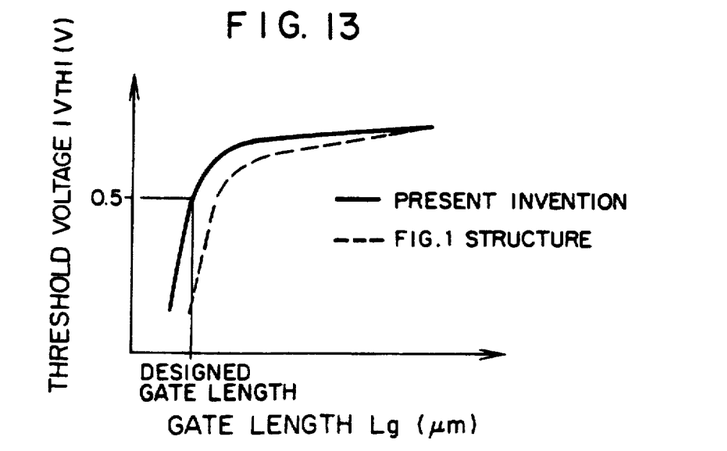
FIG. 13 is a graph showing the relation between the gate length and the threshold voltage of a MOS transistor.

FIG. 7 shows a MOS device structure having impurity concentration distribution shown in FIG. 8 which has been mentioned already. The concentration distribution at the interface between the n type impurity layer 361 having the concentration distribution illustrated at $N_{Q11n}$ and the surface p type impurity layer 141 having the concentration distribution illustrated at $N_{Q11p}$ is sharpened by newly adding the n type impurity layer 361 to increase the impurity concentration of the n type well 24 (from $N_{Q11n}$ to $N_{Q11}$) at the junction between the layers 141 and 361. Therefore, as represented by hatching lines in FIG. 12, the expansion of the depletion layer in a thicknesswise direction of the well 24 which extends from the drain region 36 of the p type MOSFET $Q_{11}$ is suppressed and the dependency of the threshold voltage $V_{TH}$ on the gate length $L_g$ will assume a curve in FIG. 13 so that the short channel effect can be suppressed and the drain current can be stably increased.

Furthermore, in the n type MOSFET $Q_{12}$, the impurity concentration $N_{Q12W}$ of the p type well 25 at a junction between the n type impurity layer 362 having an impurity concentration represented at $N_{Q12n}$ and the surface p type impurity layer 142 having an impurity concentration represented at $N_{Q12p}$ is decreased from $N_{Q12W}$ to $N_{Q12}$ by newly adding the n type impurity layer 362. Accordingly, the strength of electric field in the junction is weakened to increase the mobility so that the drain current on operation can be increased. Since the concentration of the n type impurity layer 362 is lower than that of the p type well 25, an influence of the layer 362 upon the bipolar transistor $Q_{13}$ formed on one and the same substrate is negligible.

In accordance with the aforementioned embodiment, the effects can be obtained as follows:

(1) A desired threshold voltage can be obtained since a p type impurity layer is provided in a surface portion of an n type well region immediately under a gate insulating layer (gate electrode) of a PMOS transistor in a BiCMOS structure.

(2) Since an n type impurity layer is provided on the side of a p type impurity layer facing a substrate although the p type impurity layer is provided in a surface portion of an n type well immediately under a gate insulating layer of a PMOS transistor in a BiCMOS structure in accordance with the above paragraph (1), the impurity concentration curve at the pn junction is sharpened so that the expansion of a depletion layer expanding from the drain is suppressed.

(3) Since the extension of the depletion layer is suppressed in a PMOS transistor in accordance with the above paragraph (2), the short channel effect can be suppressed. Accordingly, shortening of the gate length can be achieved by the suppression of the short channel effect so that a pattern can be made finer and integration density can be made higher.

(4) Although a p type impurity layer is provided in a surface portion of a p type well region immediately under a gate insulating layer (gate electrode) of an NMOS transistor, an n type impurity layer is provided in the inner side of type p type impurity layer. Accordingly, the impurity concentration at an interface between the p typg impurity region and the p type well under a gate electrode becomes lower so that the strength of the electric field can be made lower. Therefore, increase in the drain current can be achieved.

(5) Composite impurity layers, each including a p type impurity layer and an n type impurity layer are provided in an n type well and a p type well in a BiCMOS structure. Since the concentration of the n type impurity layer is lower than that of the n type well, an influence of the composite impurity layer upon a bipolar transistor formed on one and the same substrate can be negligible.

(6) The p type impurity layer and the n type impurity layer are formed in the surface portions of n type and p type wells by ion implantation thereto in the BiCMOS structure. The implanted impurity is uniformed by carrying out the ion implantation through an insulating layer so that the impurity is distributed at a high precision and a good reproducibility.

(7) In accordance with paragraphs (1) through (6), the short channel effect can be suppressed and increase in the drain current can be achieved in the PMOS transistor and an improvement in electron mobility can also be achieved to increase the drain current in the NMOS transistor. Therefore, a BiCMOS device having a high drive ability, a fast operation speed and a high integration degree can be provided.

Having described the present invention made by the present inventor with reference to the embodiment in detail, it is to be understood that the present invention is not limited to only the above mentioned embodiments, and various changes and modifications are possible without departing from the spirit and scope of the following claims.

Although the present invention made by the present inventor has been described with reference to the embodiment in which the present invention is applied to a submicron BiCMOS manufacturing technology which is a background utilization field of the present invention, it is to be understood that the present invention is not limited to only these embodiments.

The present invention can be applied to at least a technology for manufacturing semiconductor devices having CMOSs incorporated therein.

I claim:

1. A method of manufacturing a semiconductor device, comprising the steps of:

forming a first buried layer of a first conductivity type, a second buried layer of a second conductivity type and a third buried layer of said first conductivity type on a surface of a semiconductor substrate, said first to third buried layers being formed in different regions of said surface of said semiconductor substrate from one another, said second conductivity type being opposite to said first conductivity type;

forming an epitaxial layer on said first to third buried layers;

forming a first well region of said first conductivity type, a second well region of said second conductivity type and a third well region of said first conductivity type in said epitaxial layer respectively, said first to third well regions being formed on said first to third buried layers respectively, said first to third well regions having surface portions which correspond to an upper surface of said epitaxial layer respectively, wherein each of said first, second and third well regions has an impurity concentration decreasing uniformly from said surface portions to said first, second and third buried layers, respectively;

introducing first impurities of said second conductivity type into entire said first and second well regions, to form a first doped layer of said second conductivity type and a second doped layer of said second conductivity type in said surface portions of said first and second well regions respectively;

introducing second impurities of said first conductivity type into entire said first and second well regions so as to increase an effective impurity concentration of said first well region of said first conductivity type at the bottom of said first doped layer and decrease an effective impurity concentration of said second well region of said second conductivity type at the bottom of said second doped layer;

forming, after the steps of introducing said first and second impurities, an insulated gate electrode of a first MISFET of said second conductivity type over said first doped layer in said first well region;

forming, after the steps of introducing said first and second impurities, an insulated gate electrode of a second MISFET of said first conductivity type over said second doped layer in said second well region;

forming source and drain regions of said first conductivity type of said second MISFET in said second well region at the both sides of said insulated gate electrode of said second MISFET;

forming source and drain regions of said second conductivity type of said first MISFET in said first well region at the both sides of said insulated gate electrode of said first MISFET;

forming a base region of said second conductivity type of a bipolar transistor in said third well region; and forming an emitter region of said first conductivity type of said bipolar transistor in said base region.

2. A method of manufacturing a semiconductor device according to claim 1, wherein the step of introducing said first impurities of said second conductivity type and the step of introducing said second impurities of said first conductivity type include an ion implantation respectively, and wherein he ion implantation of said second impurities is performed at the implantation energy higher than that of said first impurities.

3. A method of manufacturing a semiconductor device according to claim 1, wherein said first conductivity type is an n-type and said second conductivity type is a p-type.

4. A method of manufacturing a semiconductor device according to claim 3, wherein said semiconductor substrate has said second conductivity type.

5. A method of manufacturing a semiconductor device according to claim 1, wherein said first and third well regions are simultaneously formed by diffusion of impurities of said first conductivity type.

6. A method of manufacturing a semiconductor device according to claim 1, wherein the step of introducing said second impurities of said first conductivity type is carried out to form a third doped layer and a fourth doped layer into said first and second well regions respectively so that said third doped layer is formed at the bottom of said first doped layer and said fourth doped layer is formed at the bottom of said second doped layer, wherein said third doped layer has said first conductivity type and has an impurity concentration higher than said effective impurity concentration of said first well region of said first conductivity type, and wherein said fourth doped layer has said second conductivity type and has an impurity concentration lower than said effective impurity concentration of said second well region of said second conductivity type.

7. A method of manufacturing a semiconductor device according to claim 6, wherein a position of said first well region below said gate electrode of said first MISFET has said first and third doped layers, wherein a position of said second well region below said gate electrode of said second MISFET has said second and fourth doped layers.

8. A method of manufacturing a semiconductor device according to claim 7, wherein said third doped layer is in contact with said drain regions of said first MISFET, wherein said fourth doped layer is in contact with said drain regions of said second MISFET.

9. A method of manufacturing a semiconductor device according to claim 8, wherein said third doped layer is in contact with said drain regions of said first MISFET for suppressing the expansion of the depletion layer in a thicknesswise direction of said first well region which extends from said drain regions of said first MISFET.

10. A method of manufacturing a semiconductor device according to claim 8, wherein concentrations of said first and second doped layers are higher than concentrations of said first and second well regions, wherein said first impurities are introduced to control threshold voltages of said first and second MISFETs.

11. A method of manufacturing a semiconductor device according to claim 1, wherein said first and second impurities are introduced into entire said first, second and third well regions.

12. A method of manufacturing a semiconductor device according to claim 1, further comprising the steps of: before the steps of introducing said first and second impurities, forming a collector leading diffusion region of bipolar transistor in said third well region, said collector leading diffusion region having said first conductivity type and being in contact with said third buried layer.

13. A method of manufacturing a semiconductor device according to claim 12, further comprising the step of:
before the step of introducing said first and second impurities, forming an element isolating film on said surface portions of said first, second and third well regions.

14. A method of manufacturing a semiconductor device according to claim 13, wherein said first and second impurities are introduced in self-alignment with said element isolating film.

15. A method of manufacturing a semiconductor device, comprising the steps of:
forming a first buried layer of a first conductivity type, a second buried layer of a second conductivity type and a third buried layer of said first conductivity type on a surface of a semiconductor substrate, said first to third buried layers being formed in different regions of said surface of said semiconductor substrate from one another, said second conductivity type being opposite to said first conductivity type;

forming an epitaxial layer on said first to third buried layers;

forming a first well region of said first conductivity type and a second well region of said second conductivity type in said epitaxial layer respectively, said first and second well regions being formed on said first and second buried layers respectively, said first and second well regions having surface portions which correspond to an upper surface of said epitaxial layer respectively, wherein each of said first and second well regions has an impurity concentration which decreases uniformly from said surface portions to said first and second buried layers, respectively;

introducing first impurities of said second conductivity type into entire said first and second well regions to form a first doped layer of said second conductivity type and a second doped layer of said second conductivity type in said surface portions of said first and second well regions respectively;

introducing second impurities of said first conductivity type into entire said first and second well regions so as to increase an effective impurity concentration of said first well region of said first conductivity type at the bottom of said first doped layer and decrease an effective impurity concentration of said second well region of said second conductivity type at the bottom of said second doped layer;

forming, after the steps of introducing said first and second impurities, an insulated gate electrode of a first MISFET of said second conductivity type over said first doped layer in said first well region;

forming, after the steps of introducing said first and second impurities, an insulated gate electrode of a second MISFET of said first conductivity type over said second doped layer in said second well region;

forming source and drain regions of said first conductivity type of said second MISFET in said second well region at the both sides of said insulated gate electrode of said second MISFET; and forming source and drain regions of said second conductivity type of said first MISFET in said first well region at the both sides of said insulated gate electrode of said first MISFET.

16. A method of manufacturing a semiconductor device according to claim 15, wherein the step of introducing said first impurities of said second conductivity type and the step of introducing said second impurities of said first conductivity type include an ion implantation respectively, and wherein the ion implantation of said second impurities is performed at the implantation energy higher than that of said first impurities.

17. A method of manufacturing a semiconductor device according to claim 15, wherein said first conductivity type is an n-type and said second conductivity type is a p-type.

18. A method of manufacturing a semiconductor device according to claim 15, wherein the step of introducing said second impurities of said first conductivity type is carried out to form a third doped layer and a fourth doped layer into said first and second well regions respectively so that said third doped layer is formed at the bottom of said first doped layer and said fourth doped layer is formed at the bottom of said second doped layer, wherein said third doped layer has said first conductivity type and has an impurity concentration higher than said effective impurity concentration of said first well region of said first conductivity type, and wherein said fourth doped layer has said second conductivity type and has an impurity concentration lower than said effective impurity concentration of said second well region of said second conductivity type.

19. A method of manufacturing a semiconductor device according to claim 18, wherein a position of said first well region below said gate electrode of said first MISFET has said first and third doped layers, wherein a position of said second well region below said gate electrode of said second MISFET has said second and fourth doped layers.

20. A method of manufacturing a semiconductor device according to claim 19, wherein said third doped layer is in contact with said drain regions of said first MISFET, wherein said fourth doped layer is in contact with said drain regions of said second MISFET.

21. A method of manufacturing a semiconductor device according to claim 20, wherein said third doped layer is in contact with said drain regions of said first MISFET for suppressing the expansion of the depletion layer in a thicknesswise direction of said first well region which extends from said drain regions of said first MISFET.

22. A method of manufacturing a semiconductor device according to claim 20, wherein concentrations of said first and second doped layers are higher than concentrations of said first and second well regions, wherein said first impurities are introduced to control threshold voltages of said first and second MISFETs.

23. A method of manufacturing a semiconductor device according to claim 15, wherein said semiconductor substrate has said second conductivity type.

* * * * *

UNITED STATES PATENT AND TRADEMARK OFFICE
CERTIFICATE OF CORRECTION

PATENT NO. : 5,290,714
DATED : March 1, 1994
INVENTOR(S) : Kazunori Onozawa

It is certified that error appears in the above-indentified patent and that said Letters Patent is hereby corrected as shown below:

On the title page, item [56], References Cited, Other Publications insert the following:

IEDM 85, pp. 423-426, IEEE 1985, titled HIGH SPEED BiCOMOS VLSI TECHNOLOGY WITH BURIED TWIN WELL STRUCTURE;

Col. 12, line 16, Claim 1, "on" should be --over--;
Col. 12, line 22, Claim 1, delete "uniformly";
Col. 12, line 23, Claim 1, "to" should be --toward--;
Col. 12, line 68, Claim 2, "he" should be --the--;
Col. 14, line 28, Claim 15, "on" should be --over--;
Col. 14, line 34, Claim 15, delete "uniformly";
Col. 14, line 35, Claim 15, "to" should be --toward--.

Signed and Sealed this

Fourteenth Day of March, 1995

*Attest:*

BRUCE LEHMAN

*Attesting Officer*     *Commissioner of Patents and Trademarks*